United States Patent
Durham et al.

(10) Patent No.: US 10,465,278 B2
(45) Date of Patent: Nov. 5, 2019

(54) COATING CONTAINING MACROPARTICLES AND CATHODIC ARC PROCESS OF MAKING THE COATING

(71) Applicant: MDS COATING TECHNOLOGIES CORP., St. Laurent, Quebec (CA)

(72) Inventors: Simon Durham, Westmount (CA); Stefan Tzanev, St-Lazare (CA); Manuel Mendez, Senneville (CA); Steve Guetre, Point Claire (CA)

(73) Assignee: MDS COATING TECHNOLOGIES CORP., St Laurent, Quebec (CA)

( * ) Notice: Subject to any disclaimer, the term of this patent is extended or adjusted under 35 U.S.C. 154(b) by 0 days.

(21) Appl. No.: 14/911,038

(22) PCT Filed: Aug. 18, 2014

(86) PCT No.: PCT/CA2014/000627
§ 371 (c)(1),
(2) Date: Feb. 9, 2016

(87) PCT Pub. No.: WO2015/024098
PCT Pub. Date: Feb. 26, 2015

(65) Prior Publication Data
US 2016/0201186 A1    Jul. 14, 2016

Related U.S. Application Data

(60) Provisional application No. 61/867,751, filed on Aug. 20, 2013.

(51) Int. Cl.
*C23C 14/32* (2006.01)
*C23C 14/14* (2006.01)
(Continued)

(52) U.S. Cl.
CPC ............ *C23C 14/325* (2013.01); *C23C 14/06* (2013.01); *C23C 14/0688* (2013.01); *C23C 14/14* (2013.01); *F01D 5/288* (2013.01)

(58) Field of Classification Search
CPC ........ C23C 14/325; F01D 5/286; F01D 5/288
(Continued)

(56) References Cited

U.S. PATENT DOCUMENTS 4,898,368 A * 2/1990 Schaffer .................... C21C 5/34
266/222
5,753,251 A 5/1998 Burrell
(Continued)

FOREIGN PATENT DOCUMENTS

EP    1722003    11/2006
JP    06-306581   11/1994
(Continued)

OTHER PUBLICATIONS

International Search Report issued in PCT/CA2014/000627, dated Nov. 3, 2014, pp. 1-4.
(Continued)

*Primary Examiner* — Jose Hernandez-Diaz
(74) *Attorney, Agent, or Firm* — Jeffrey S. Melcher; Melcher Patent Law PLLC

(57) ABSTRACT

Provided is a method of cathodic arc process for making a coating containing macroparticles and a coating containing macroparticles. The process comprising inserting a work piece into a cathodic arc apparatus, vaporizing a cathodic material and adjusting the parameters of the arc to form liquid, semi-solid or solid macroparticles which are embedded into or onto the coating.

17 Claims, 3 Drawing Sheets

(51) Int. Cl.
*C23C 14/06* (2006.01)
*F01D 5/28* (2006.01)

(58) Field of Classification Search
USPC ........ 427/446–456, 580; 204/192.38, 298.41
See application file for complete search history.

(56) References Cited

U.S. PATENT DOCUMENTS

| | | | |
|---|---|---|---|
| 6,797,335 | B1 | 9/2004 | Paderov |
| 2002/0046941 | A1 | 4/2002 | Takigawa |
| 2004/0126492 | A1* | 7/2004 | Weaver ................... C23C 14/16 427/250 |
| 2007/0259427 | A1 | 11/2007 | Storey |
| 2008/0102296 | A1* | 5/2008 | Ghasripoor ......... C23C 14/0641 428/469 |
| 2009/0297720 | A1* | 12/2009 | Ramgopal ................ C23C 4/06 427/455 |
| 2011/0143054 | A1 | 6/2011 | Kurapov |
| 2013/0052477 | A1* | 2/2013 | Lechthaler .......... C23C 14/0641 428/623 |
| 2017/0030204 | A1* | 2/2017 | Gorokhovsky ......... F01D 5/288 |

FOREIGN PATENT DOCUMENTS

| | | | |
|---|---|---|---|
| JP | 06306581 | A * | 11/1994 |
| JP | 2000-239829 | | 9/2000 |
| JP | 2004-316850 | | 11/2004 |
| JP | 2004316850 | A * | 11/2004 |
| JP | 2008-163449 | | 7/2008 |
| JP | 2013-082058 | | 5/2013 |
| JP | 2013082058 | A * | 5/2013 |
| WO | 2007/087269 | | 8/2007 |

OTHER PUBLICATIONS

Written Opinion issued in PCT/CA2014/000627, dated Nov. 3, 2014, pp. 1-5.
European Search Report issued in European Patent Application No. 14837670.0, dated Aug. 3, 2017, pp. 1-11.
Vyskocil, "Cathodic arc evaporation in thin film technology," Journal of Vacuum Science and Technology: Part A, AVS/AIP, Melville, NY, US., vol. 10, No. 4, Pt. 11, Jul. 1, 1992, pp. 1740-1748.
Japanese Office Action issued in JP Application No. 2016-535279, dated Apr. 16, 2018, pp. 1-6, Translation.

* cited by examiner

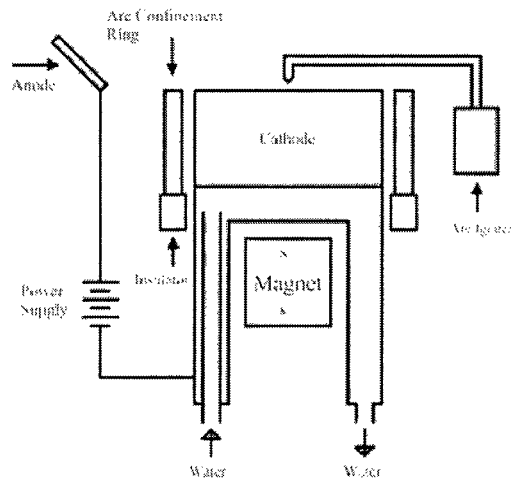
Cathodic arc source (Sablev type)
Fig. 1 [Prior Art]
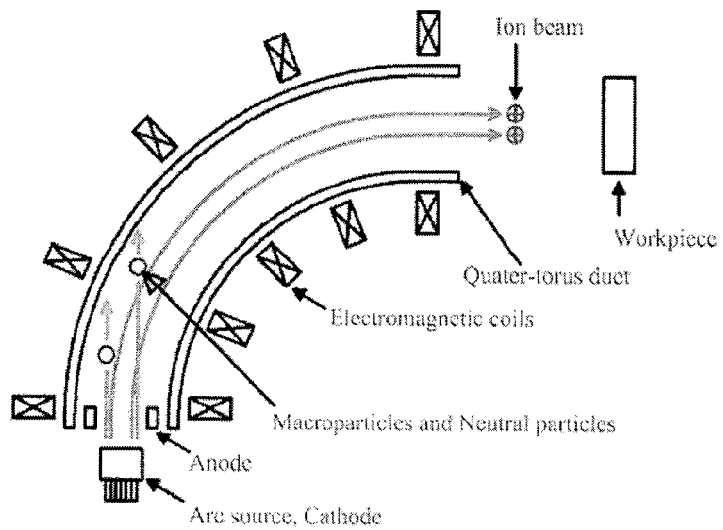
Aksenov's quater-torus macroparticle filter
Fig. 2 [Prior Art]

A, B, C = Cathodic Arc Sources (Material Deposition)

COATING CONTAINING MACROPARTICLES AND CATHODIC ARC PROCESS OF MAKING THE COATING

This application claims priority to U.S. provisional patent application Ser. No. 61/867,751, filed 20 Aug. 2013, the complete disclosure of which is incorporated herein by reference.

FIELD OF THE INVENTION

The invention relates to a cathodic arc method of making a coating containing macroparticles and a coating containing macroparticles.

BACKGROUND OF THE INVENTION

Cathodic Arc Physical Vapor Deposition processes (CAPVD) for applying coatings to a surface of a work piece are now well known. CAPVD is also known as ion plasma deposition, as described in U.S. Pat. No. 6,797,335, the complete disclosure of which is incorporated herein by reference.

The CAPVD process is generally conducted by striking an arc against the surface of a metallic cathodic target material that vaporizes material from the surface. The vaporized material is released in the form of highly ionized plasma (atoms) that can react with a gas on a work piece to form a coating. An example is titanium (vaporized from the metallic cathodic material) and nitrogen (the gas) to form a titanium nitride (TiN) coating on the work piece. Another example is aluminum-titanium-nitride (AlTiN or TiAlN). These coatings are very hard and highly resistant to erosion.

An example of a CAPVD process is the Sablev type cathodic arc source which comprises a short cylindrical shape electrical conductive target at the cathodic material with one open end, which is shown in FIG. 1 [Prior Art]. The anode for the apparatus can be either the vacuum chamber wall or a discrete anode. Arc spots are generated by mechanical trigger (or igniter) striking an open end of the cathodic material making a temporarily short circuit between the cathodic material and anode. After the arc spots have been generated they can be steered in defined areas of the cathode or move randomly over the cathode surface depending on the nature and orientation of the magnetic field around or near the cathode material.

The conditions of the CAPVD process can sometimes be such that un-reacted metal from the cathodic material can form metal particles in the coating that are referred to as macroparticles. The presence of these macroparticles is considered a structural defect in the coating, and can lead to cracks and fissures that weaken the coating. Thus, CAPVD processes are optimized to avoid the formation of these macroparticles or filters are used to remove them. An example of a CAPVD process that uses such a filter is the Aksenov quarter-torus duct macroparticle filter, shown in FIG. 2 [Prior Art], which consists of a quarter-torus duct bent at 90 degrees from the arc source and the plasma is guided out of the duct by principle of plasma optics, whereas the macroparticles continue on a straight path unaffected by the magnetic fields of the duct.

SUMMARY OF THE INVENTION

We have now found that the CAPVD process can be modified so that macroparticles can be shaped, sized, composition altered and/or quantified to provide desired properties to the coating. Examples of desired properties are lubrication, hydrophobic, hydrophilic, corrosion resistance, erosion resistance, surface texture, electrical resistance or any other desired property. The macroparticles are formed by the CAPVD process.

Objectives of the invention can be provided by a method of forming a coating on a work piece comprising:
inserting a work piece into a cathodic arc apparatus;
vaporizing at least one cathodic material by applying an arc to the cathodic material to form atoms of the cathodic material in an atmosphere within the apparatus so that the atoms form a coating on the work piece; and
adjusting parameters of the arc to form liquid, semi-solid, or solid macroparticles of the cathodic material so that the macroparticles embed into or onto the coating, wherein a structure and/or composition of the macroparticles is selected to provide a desired property to the coating.

Objectives of the invention can also be obtained by a method of forming a coating on a work piece comprising:
inserting a work piece into a cathodic arc apparatus;
vaporizing a first cathodic material by applying a first arc under conditions to the first cathodic material to form atoms of the first cathodic material in an atmosphere within the apparatus so that the atoms form a coating comprising the first cathodic material on the work piece; and
forming liquid, semi-solid, or solid macroparticles by applying a second arc to a second cathodic material under conditions to form the macroparticles of the second cathodic material so that the macroparticles embed into or onto the coating, wherein a structure and/or composition of the macroparticles is selected to provide a desired property to the coating, wherein the workpiece is an airfoil.

Objectives of the invention can be further obtained by a coated aerofoil comprising:
an aerofoil having a surface; and
a coating having macroparticles, wherein the coating is formed on the surface by a cathodic arc process under conditions which form the macroparticles, wherein a structure and/or composition of the macroparticles is selected to provide a desired property to the coating.

A method of forming a coating on a work piece comprising:
inserting a work piece into a cathodic arc apparatus;
vaporizing a first cathodic material by applying a first arc under conditions to the first cathodic material to form atoms, ions and macroparticles of the first cathodic material in an atmosphere within the apparatus so that the atoms form a coating comprising the first cathodic material on the work piece; and
forming liquid, semi-solid, or solid macroparticles by applying a second arc to a second cathodic material under conditions to form the macroparticles of the second cathodic material so that the macroparticles embed into or onto the coating, wherein a structure and/or composition of the macroparticles is selected to provide at least one property to the coating selected from lubrication, hydrophobic, hydrophilic, sacrificial corrosion resistance, erosion resistance, surface texture, self-healing and/or electrical resistance, wherein the workpiece is an airfoil.

BRIEF DESCRIPTION OF THE DRAWINGS

FIG. 1 illustrates a prior art cathodic arc process apparatus;

FIG. 2 illustrates a prior art cathodic arc process apparatus;

DETAILED DESCRIPTION OF PREFERRED EMBODIMENTS

Figure 3:
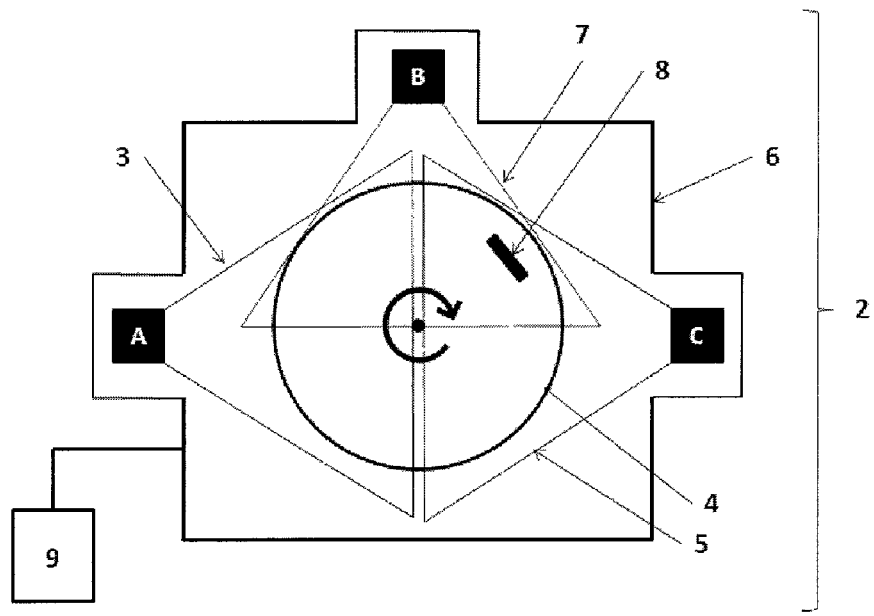
FIG. 3 illustrates a cathodic arc process apparatus.

The invention will now be explained with reference to that attached non-limiting Figs. An exemplary CAPVD apparatus 2 is shown in FIG. 3 having a chamber 6 and a source of gas 9 connected to the chamber 6. Three cathodic materials A, B and C are shown, however, any number of cathodic materials can be used. The chamber has a turntable 4, upon which the work piece 8 is placed. During operation an arc is generated on each of the cathodic materials A, B and C to form an associated stream 3, 5 and 7 in the general shape of a cone. The turntable 4 turns during operation exposing the work piece 8 to each of the streams 3, 5 and 7. The present invention is not limited by this exemplary CAPVD apparatus 2, and any other desired CAPVD apparatus may be used to practice the claimed invention.

At least one of the streams 3, 5 and 7 comprises atoms of at least one cathodic material A, B or C. The atoms form a coating on the work piece 8. The atoms can also react with the gas 9 supplied to the chamber and/or atoms from other streams to form a compound coating. For example, if the atoms comprise titanium and the gas comprises nitrogen, the coating can comprise titanium nitride.

The work piece 8 to be coated is preferably an aircraft part, such as an airfoil. However, if desired the work piece can be any desired structure, such as drill bits, routers, saw blades, or any other tool. The work piece 8 can be formed of any desired material, such as steel, nickel and titanium and alloys thereof.

Examples of suitable cathodic materials include titanium, aluminum, chromium and mixtures thereof. Titanium and aluminum are preferred. Particularly preferred cathodic materials that can be deposited as metals and/or in reactive gas to form nitrides, carbides, oxides or mixtures thereof are chromium, aluminum, titanium and other group IV, V and VI transition metals from the periodic table, as well as the lanthanide series of metals, such as but not limited to lanthanum, cerium, neodymium and gadolinium.

Examples of suitable gases include nitrogen and argon, and mixtures thereof. While nitrogen and argon are preferred, other gases, such as hydrocarbons, for example acetylene, or oxygen and any other gas, can be used to provide desired properties to the macroparticles and/or coating.

Figure 4:
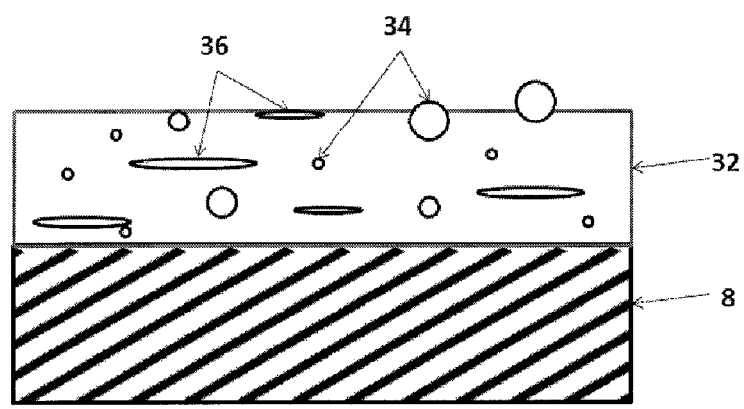
FIG. 4 illustrates a coating having macroparticles.

The process is conducted so that at least one of the streams contains macroparticles comprising a solid, semi-solid or liquid state of the cathodic material, which embed into and/or onto the coating. An example of a coating 32 formed on the work piece 8 is shown in FIG. 4. Macroparticles 34 and 36 are shown as being embedded into and/or onto the coating 32.

The properties and composition of the macroparticles can be adjusted by selecting the cathodic materials and/or gases to provide the desired properties and composition. The size, shape, and/or quantity of macroparticles can be varied by adjusting the process conditions, such as the amperage and/or gas composition. In general, the greater the amperage the larger the quantity of particles, the more liquid the particles will be when formed, and the more lenticular the particles will be when they are deposited on the surface.

Without being bound by any theory, we believe that spherical macroparticles 34 can be formed by using a high melting temperature material and/or adjusting the arc conditions so that the macroparticles 34 formed are in a solid or semi-solid state when contacting the coating 32 so that a spherical shape is maintained. Examples of high melting materials include titanium, zirconium and chromium and mixtures of titanium, zirconium and chromium with other elements. The use of spherical macroparticles 34 generally results in rough surface on the coating.

Without being bound by any theory, we believe that lenticular macroparticles 36 can be formed by using a low melting temperature material and/or adjusting the arc conditions so that the macroparticles 36 formed are in a liquid state when contacting the coating 32 so that the macroparticles 36 flatten during solidification of the macroparticles 36. Examples of low melting materials include aluminum and mixtures of aluminum with other elements. If the long axis of the lenticular macroparticle 36 is aligned substantially parallel with the coating surface 32, the coating surface 32 will be smooth. The use of aluminum macroparticles 36 having a flat lenticular shape has been found to reduce the formation of conical growth defects that normally form above spherical macroparticles 34.

The macroparticles 34, 36 can be formed of materials selected to provide a desired property to the coating 32.

To enhance the corrosion resistance of the coating, the macroparticles 34, 36 can be formed from aluminum or a material having a high aluminum content. Other suitable sacrificial materials besides aluminum are zinc or magnesium elements or alloys. Without being bound by any theory, the corrosion resistance can be further enhanced by the formation of aluminum hydroxide, which forms in corrosive environments and blocks pores and crevices and in so doing prevents corrosive agents from reaching the substrate, in addition providing self-healing properties.

A lubricious material, such as molybdenum disulphide, vanadium, or vanadium nitride, can be used as the particle material 34, 36 to provide the coating with greater lubricity. Molybdenum disulphide is a solid-state lubricant used widely in the aerospace industry to reduce wear. Vanadium oxidizes at room temperature and vanadium nitride oxidizes at higher temperatures and under wear conditions to form vanadium oxide which is highly lubricious. Without being bound by any theory it is believed that the presence of macroparticles comprising materials such as vanadium or molybdenum disulfide within the coating enhances the lubricious nature of the coating to reduce the coefficient of friction and wear rate.

The macroparticles can also be constructed to provide hydrophilic, hydrophobic and/or catalytic properties to the coating. The macroparticles can be provided with the desired properties by selecting cathodic materials and/or gasses to provide metals, alloys or compounds in the macroparticles having the desired properties, which properties are provided to the coating by the presence of the macroparticles therein.

The macroparticles can be constructed to lower the corrosion potential of the coating to below that of the workpiece. For example, using macroparticles having a high aluminum content, for example at least 70 at % aluminum, preferably at least 80 at % aluminum, and more preferably at least 90 at % aluminum, TiAlN coatings. Without being bound by any theory, it is believed that a top layer comprising a continuous phase of AlN that surrounds macroparticles of free aluminum can provide beneficial sacrificial corrosion properties relative to steels in the galvanic series in seawater.

While the cathodic materials A, B and C are shown in the same plane as the work piece 8 in FIG. 3, if desired, the cathodic materials A, B and C can be in any desired location. For example, a cathodic material can be disposed over the coating 32 being formed so that the macroparticles sputter or splat onto the coating as it is being formed.

Figure 5:
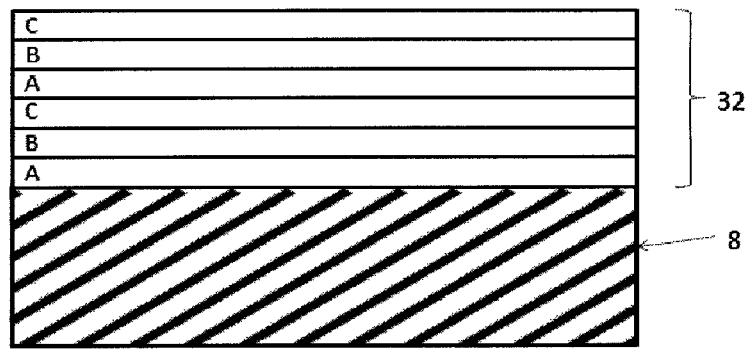
FIG. 5 illustrates a coating having multiple layers.

More than one coating layer can be applied to the work piece to form the coating 32, as shown in FIG. 5. The different layers can provide different functionalities. Furthermore, the macroparticles can be applied to the coating 32 at any time during the process, such as before the coating 32 is applied, during application of the coating 32 or different layers of the coating, and/or after the coating 32 is formed on the work piece 8.

EXAMPLES

The invention will now be further described with reference to the following non-limiting experimental examples.

Example 1

Figure 6:
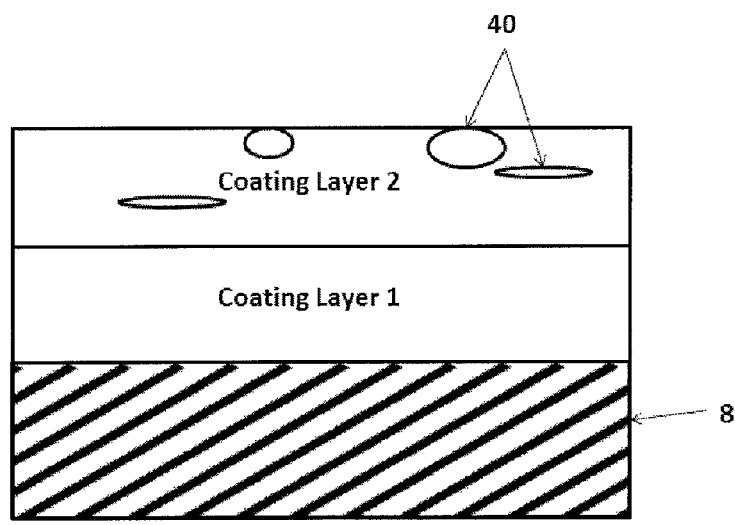
FIG. 6 illustrates a coating having multiple layers with macroparticles.

Two coating layers were applied to a work piece using the following conditions.
Coating layer 1
3 Cathodes
2×Al
1×(TiAl)
Gas=N$_2$ Coating layer 2
2 Cathodes
2×Al
Gas=N$_2$+Ar Reducing the partial pressure of N$_2$ during the deposition of layer 2 increased the size of the aluminum macroparticles 40 as shown in FIG. 6. Also the size of the macroparticles can be increased by reducing the total pressure. The free aluminum provides sacrificial corrosion resistance to the coating and substrate.

While the claimed invention has been described in detail and with reference to specific embodiments thereof, it will be apparent to one of ordinary skill in the art that various changes and modifications can be made to the claimed invention without departing from the spirit and scope thereof.

The invention claimed is:

1. A method of forming a metal-nitride coating on a work piece comprising:
    inserting a work piece into a cathodic arc apparatus;
    vaporizing at least one metallic cathodic material by applying an arc to the metallic cathodic material to form atoms, ions and metallic macroparticles of the metallic cathodic material in an atmosphere comprising nitrogen within the apparatus so that the atoms form the metal-nitride coating on the work piece; and
    adjusting parameters of the arc to form liquid, semi-solid, or solid metallic macroparticles of the metallic cathodic material so that the metallic macroparticles embed into or onto the metal-nitride coating, wherein a structure and/or composition of the metallic macroparticles is selected to provide a sacrificial corrosion resistance property to the coating, wherein the work piece is an airfoil, and wherein the metallic cathodic material is selected or the arc is applied in a manner to provide lenticular metallic macroparticles.

2. The method according to claim 1, wherein the metallic cathodic material and the metallic macroparticles comprise aluminum.

3. The method according to claim 1, wherein the metallic macroparticles comprise at least 70 at % aluminum to provide the metal-nitride coating with a sacrificial component that is less noble than the work piece.

4. The method according to claim 1, wherein the metallic macroparticles comprise at least 90 at % aluminum to provide the metal-nitride coating with a sacrificial component that is less noble than the work piece.

5. The method according to claim 1, wherein the metallic cathodic material comprises at least one selected from the group consisting of chromium, aluminum, titanium and other group IV, V and VI transition metals from the periodic table.

6. The method according to claim 1, wherein the metal-nitride coating comprises multiple layers.

7. The method according to claim 1, further comprising adjusting parameters of the arc to form liquid or semi-solid metallic macroparticles of the metallic cathodic material.

8. The method according to claim 1, further comprising adjusting parameters of the arc to form liquid metallic macroparticles of the metallic cathodic material.

9. A method of forming a metal-nitride coating on a work piece comprising:
    inserting a work piece into a cathodic arc apparatus;
    vaporizing a first metallic cathodic material by applying a first arc under conditions to the first metallic cathodic material to form atoms, ions and metallic macroparticles of the first metallic cathodic material in an atmosphere comprising nitrogen within the apparatus so that the atoms form the metal-nitride coating on the work piece; and
    forming liquid, semi-solid, or solid metallic macroparticles by applying a second arc to a second metallic cathodic material under conditions to form the metallic macroparticles of the second metallic cathodic material so that the metallic macroparticles embed into or onto the metal-nitride coating, wherein a structure and/or composition of the metallic macroparticles is selected to provide sacrificial corrosion resistance, wherein the workpiece is an airfoil, and wherein the second metallic cathodic material is selected or the second arc is applied in a manner to provide lenticular metallic macroparticles.

10. The method according to claim 9, wherein the second metallic cathodic material and the metallic macroparticles comprise aluminum or aluminum alloy.

11. The method according to claim 9, wherein the metallic macroparticles comprise at least 70 at % aluminum to provide the metal-nitride coating with a sacrificial component that is less noble than the workpiece.

12. The method according to claim 9, wherein the metallic macroparticles comprise at least 90 at % aluminum to provide the metal-nitride coating with a sacrificial component that is less noble than the workpiece.

13. The method according to claim 9, wherein the first metallic cathodic material comprises at least one selected from the group consisting of chromium, aluminum, titanium and other group IV, V and VI transition metals from the periodic table.

14. The method according to claim 9, further comprising adjusting parameters of the arc to form liquid or semi-solid metallic macroparticles of the first metallic cathodic material.

15. The method according to claim 9, further comprising adjusting parameters of the arc to form liquid metallic macroparticles of the first metallic cathodic material.

16. The method according to claim 9, further comprising adjusting parameters of the arc to form liquid or semi-solid metallic macroparticles of the second metallic cathodic material.

17. The method according to claim 9, further comprising adjusting parameters of the arc to form liquid metallic macroparticles of the second metallic cathodic material.

* * * * *